March 5, 1963 P. BREUER 3,080,510

SEMI-CONDUCTOR MOUNTING APPARATUS

Filed Jan. 19, 1959

INVENTOR
Peter Breuer
BY Francis W. Crotty
ATTORNEY

United States Patent Office 3,080,510

Patented Mar. 5, 1963

3,080,510
SEMI-CONDUCTOR MOUNTING APPARATUS

Peter Breuer, Antioch, Ill., assignor to The Rauland Corporation, a corporation of Illinois Filed Jan. 19, 1959, Ser. No. 787,551
1 Claim. (Cl. 317—234)

This invention pertains to apparatus for mounting a semi-conductor body to secure an assembly which affords a firm and rugged mechanical mount and, at the same time, effects necessary electrical connections of electrode leads to the semi-conductor body. The arrangement is generally useful in the fabrication of transistor devices but, for convenience, will be described in relation to a transistor of the triode type.

In the manufacture of transistors, it is common practice to start with a wafer of a semi-conductive material having one type conductivity and to affix on opposed surfaces thereof pellets or islands of a material having opposite conductivity to the end that these components define semi-conductive junctions at the meeting plane of the pellets with the wafer. In an illustrative case, the wafer may serve as the base zone, and the pellets may constitute emitter and collector zones all of which define the base-emitter and base-collector junctions of a triode transistor. In order to include such a device in a signal circuit, it is necessary to secure electrodes in circuit connection with the junctions and, usually, there are provided base, emitter and collector electrode leads. The physical dimensions of the transistor are of such diminutive size, particularly for transistors constructed for use in hearing aids that may be constructed within ophthalmic mounts, that the arrangement of the semi-conductor structure with its leads presents difficult fabricating problems.

One approach to this problem contemplates the use of a stem assembly which is a body of insulating material through which electrode leads project. It has been proposed that the three leads be arranged so that the center one be utilized as the primary mechanical support for the semi-conductor body. To that end, the wafer has been soldered to a conductive backing plate which, in turn, is welded to the support electrode, at the same time completing an electrical connection from the wafer to the electrode lead serving as the support. Thereafter, the other leads are deformed or bent so as to come into contact with the pellets of the semi-conductor body to be mechanically and electrically joined thereto.

While this technique of assembly has been used quite widely, it has not proved entirely satisfactory for several reasons. It has proved difficult to conveniently hold the semi-conductor and its metallic backing plate in proper space relation to the support lead for the welding operation. In other words, there are distinct problems of arranging the parts in proper geometric relation. There is the additional hazard that welding may tend to distort the wafer which is obviously undesirable because it may result in stresses within the wafer or even fracture.

It is accordingly a principal object of the present invention to provide a new and improved mounting apparatus for a semi-conductor body.

It is a specific object of the invention to provide apparatus for mounting a transistor characterized by the fact that it affords firm mechanical support and efficient electrical connections to the transistor.

Another object of the invention is to provide an improved mounting apparatus for a transistor which facilitates assembly and yet permits the fabrication of a mechanically strong and rugged device.

Apparatus embodying the invention for mounting a transistor device of the type which includes a wafer of semi-conductive material and a pellet affixed to the central portion of one face of the wafer and projecting therefrom comprises a plate of conductive material. The plate has a centrally disposed recessed portion of the same configuration as the wafer and also has a central aperture exceeding the cross-sectional dimensions of the pellet for receiving the wafer in nested relation with the pellet projecting through the aperture. A mounting receptacle is formed from an extended edge portion of the plate. A stem and mounting assembly includes a plurality of electrode leads, two of which are in alignment while a third lead, intermediate those two, has a terminal portion which is offset with respect to the others. The terminal portion is received by the mounting receptacle to effect firm electrical and mechanical connections between the plate and the assembly and to locate the transistor so that the central portion of the wafer is in substantial alignment with respect to the other two leads.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

Figure 2:
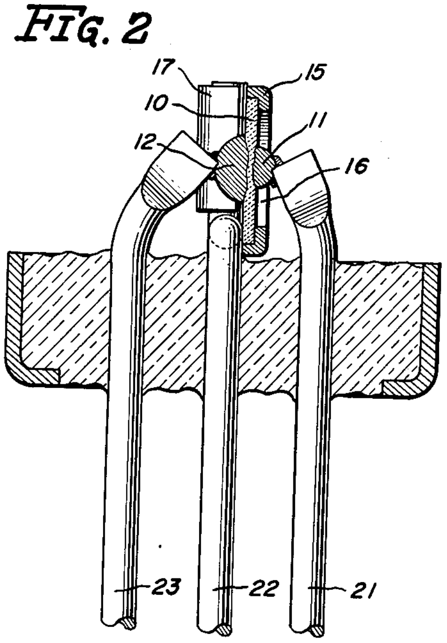
FIGURE 2 is a cross-sectional view taken along direction line 2—2 of FIGURE 1.

Before considering the mounting structure as such, consideration will be given to the semi-conductor body which, for purposes of illustration, is shown supported by the mounting structure embodying the subject invention. This semi-conductor is a triode transistor and is represented in cross-section in FIGURE 2.

It has a first zone 10 of one conductivity to which are secured pellets 11 and 12 of a material of opposite conductivity. These pellets are positioned centrally of wafer 10 on obverse faces thereof. For convenience of designation, 10 will be considered the base zone, 11 the emitter and 12 the collector zones of the transistor which, accordingly, define base-emitter and base-collector junctions at the meeting planes or areas of the pellets with the wafer. It should be pointed out that where the transistor is constructed for use in hearing aids formed within ophthalmic mounts, its physical size is small compared with that shown in FIGURE 2. It may be of the PNP or NPN type triode where N and P are designations of conductivity type as well understood in the art.

Figure 1:
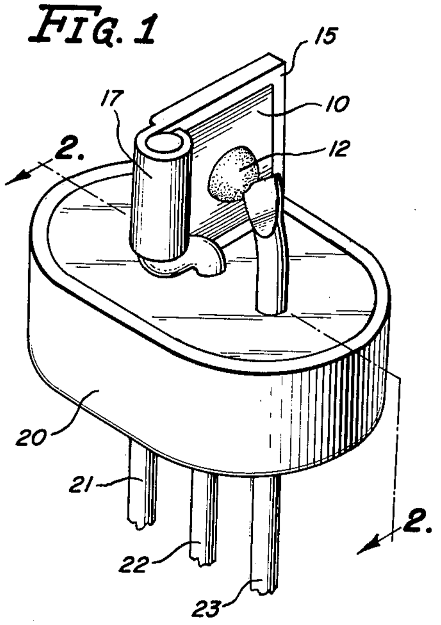
FIGURE 1 is a perspective view of a mounting structure embodying the invention and represented with a transistor secured in place thereby.

The apparatus for mounting this transistor so that it is a complete assembly for incorporation into a circuit in the manner of other known circuit components comprises a plate 15 of conductive material to which wafer 10 of the transistor may be secured. As indicated in FIGURE 1 and in the cross-sectional view of FIGURE 2, this plate has a centrally disposed recessed portion having the same configuration and depth as wafer 10 for receiving that wafer in nested relation. Moreover, the conductive plate has a centrally located aperture 16 to accommodate pellet 11 projecting from one surface of wafer 10. Aperture 16 is large compared to the maximum diameter or cross-sectional dimensions of the pellet and permits wafer 10 to seat solidly in the recess of plate 15.

Figure 3:
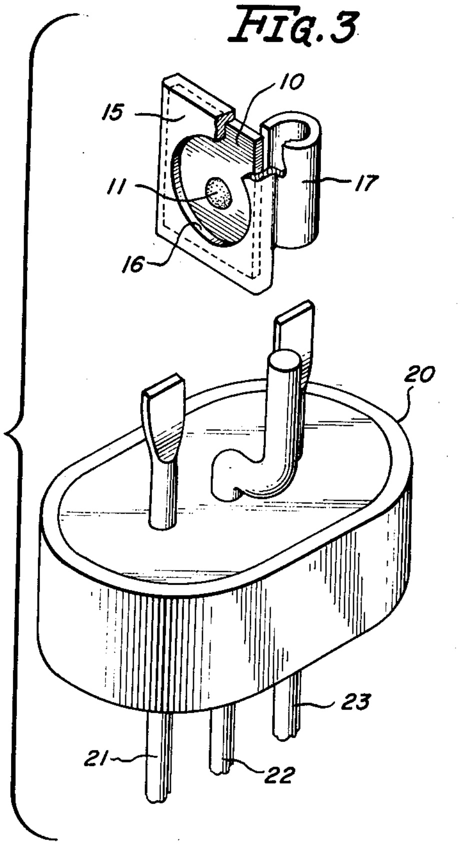
FIGURE 3 is a partially exploded view of the device of FIGURE 1 viewed from the obverse side of the mounting structure.

In order to facilitate fabricating a mechanical assembly including plate 15 as a carriage for the transistor, a mounting receptacle 17 is formed from an extended edge portion of the plate as shown most clearly in FIGURE 3. As there represented, the receptacle is a cylinder formed by rolling back an extension of one edge of plate 15. The interior diameter of receptacle 17 is only slightly larger than a support member, to be described presently, which it is intended to receive during the assembling process.

The apparatus under consideration further comprises a stem and mounting assembly 20 including a support rod projecting therefrom to be received in receptacle 17. More particularly, where the transistor is of the triode type as assumed for purposes of description, the stem assembly includes three electrode leads 21, 22 and 23 retained in insulating relation with respect to one another by an insulating compound confined within an enclosing shell of assembly 20. One end of electrode lead 21 and electrode lead 23 is flattened as represented in FIGURE 3 whereas the corresponding end of the intermediate electrode lead 22 retains its cylindrical shape although it is offset relative to the other leads as shown clearly in FIGURE 3. The offset of lead 22 is so dimensioned that when receptacle 17 is slipped thereover the median portion of wafer 10 is in substantial alignment with the remaining leads 21, 23, and contact is established between such leads and pellets 11 and 12 respectively. These leads may have a very long length and are therefore shown with indefinite terminations in the drawings because it is convenient to employ long electrode leads to facilitate the space requirements of any given installation.

In assembling the transistor to the described mounting apparatus, the interior surface of the recess formed in conductive plate 15 is coated with a thin layer of solder to form ohmic electrical contact and rugged mechanical support with semi-conductive wafer 10. The internal surface of cylindrical receptacle 17 is likewise tinned. Thereafter, the transistor is inserted into the recess of plate 15 and secured in position by a solder connection of wafer 10 to the plate. While this secures the transistor in position mechanically, it also establishes an efficient ohmic contact from the base 10 to conductive plate 15. Having thus secured the transistor, plate 15 is positioned with receptacle 17 in alignment with electrode 22 and lowered in place with the electrode lead received in the receptacle. The electrode lead is then secured, mechanically and electrically to the receptacle and this may be accomplished by soldering these parts together or they may be secured by crimping. It is preferable, however, to effect a solder connection which provides rugged mechanical strength and an efficient electrical connection. The remaining electrode leads 21 and 23 are then deformed or bent in the manner represented in FIGURE 2 and are soldered or otherwise electrically and mechanically secured to pellets 11 and 12. This completes the assembly and provides a transistor device that is both rugged and electrically efficient; it is also easily connected by means of its electrode leads 21–23 to other circuit components as required in any given circuit application.

The cooperation of receptacle 17 with the offset terminal of electrode lead 22 greatly facilitates the fabrication by relieving the difficulty experienced in the prior art in effecting the desired orientation of the transistor supporting plate with the electrode leads of the stem assembly. Obviously, this mechanism permits rapid assembly and a device having highly desirable mechanical and electrical properties.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

Apparatus for mounting a transistor device including a wafer of semi-conductive material and a pellet affixed to the central portion of one face of said wafer and projecting therefrom, said apparatus comprising: a plate of conductive material having a centrally disposed recessed portion of the same configuration as said wafer and having a central aperture exceeding the cross-sectional dimensions of said pellet for receiving said wafer in nested relation with said pellet projecting through said aperture; a mounting receptacle formed from an extended edge portion of said plate; and a stem and mounting assembly including a plurality of electrode leads, two of which are in alignment while a third lead intermediate said two has a terminal portion which is offset with respect to the others to be received by said receptacle to effect firm electrical and mechanical connections between said plate and said assembly and to locate said transistor so that the central portion of said wafer is in substantial alignment with respect to said other two leads.

References Cited in the file of this patent

UNITED STATES PATENTS

| | | |
|---|---|---|
| 2,830,920 | Colson et al. | Apr. 15, 1958 |
| 2,955,242 | Parziale | Oct. 4, 1960 |
| 2,963,632 | Kilian et al. | Dec. 6, 1960 |